United States Patent [19]

Bailey

[11] Patent Number: 4,621,199
[45] Date of Patent: Nov. 4, 1986

[54] PARALLEL GROUNDING SCHEME

[75] Inventor: Carl J. Bailey, San Jose, Calif.

[73] Assignee: Tandem Computers Incorporated, Cupertino, Calif.

[21] Appl. No.: 551,280

[22] Filed: Nov. 14, 1983

[51] Int. Cl.⁴ .................................................. H02J 1/16
[52] U.S. Cl. ..................................... 307/147; 307/89; 361/49; 361/415
[58] Field of Search .................... 307/18, 147, 89; 361/47–50, 415

[56] References Cited

U.S. PATENT DOCUMENTS

| | | |
|---|---|---|
| 3,676,739 | 7/1972 | Neuhouser ............................ 361/48 |
| 3,891,894 | 6/1975 | Scarpino ............................... 361/48 |
| 4,075,675 | 2/1978 | Burkett et al. ........................ 361/48 |
| 4,393,432 | 7/1983 | Neuhaus et al. ................. 307/326 X |

Primary Examiner—A. D. Pellinen
Assistant Examiner—Derek S. Jennings
Attorney, Agent, or Firm—Lyon & Lyon

[57] ABSTRACT

Electronic system grounding includes two system grounding paths for card caged electronic modules, with a first grounding path through the card cage and a second grounding path through the system power supply. The two system grounding paths are used to minimize noise and reduce unwanted induced superimposed transient voltage levels.

2 Claims, 1 Drawing Figure

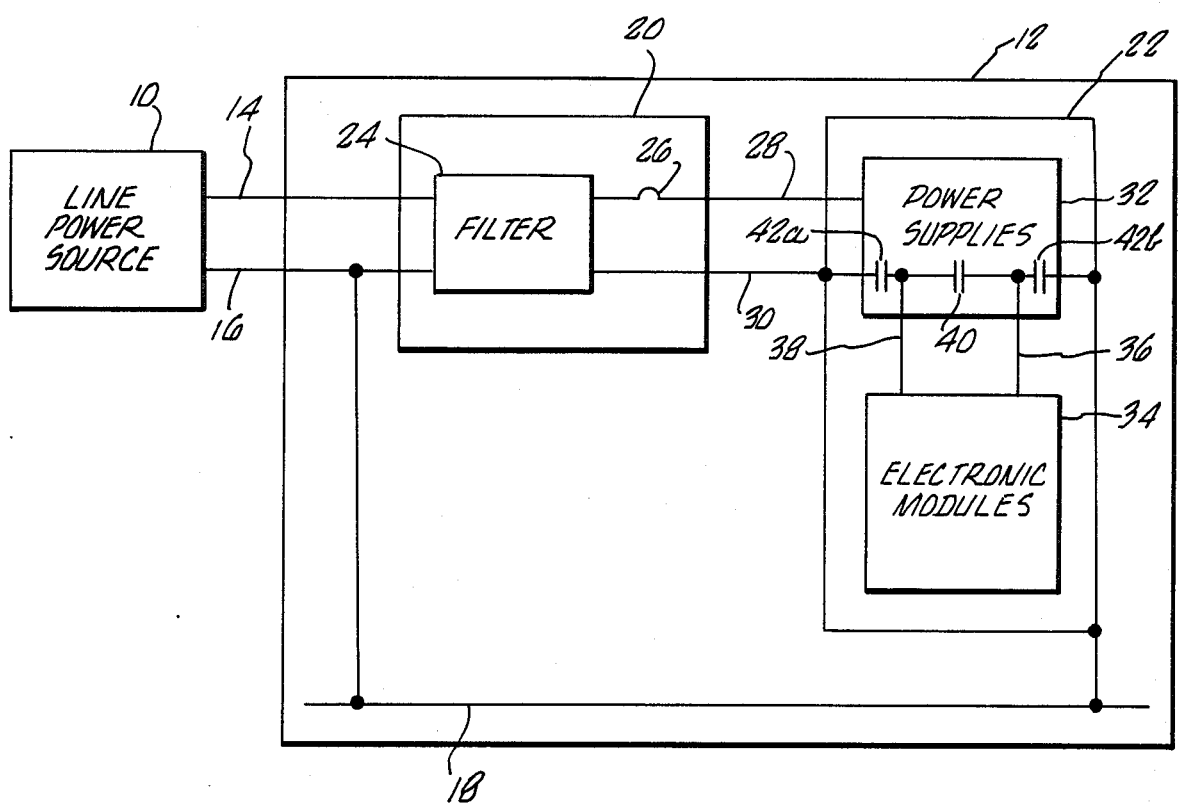

PARALLEL GROUNDING SCHEME

BACKGROUND

The present invention relates to the grounding of electronic systems. System power supply configurations locate a power supply in a system cabinet. Line power from the outside is connected to the power supply that transforms the line voltage into usable regulated voltage levels. Regulated power is then distributed to various electronic modules within the cabinet. The system cabinet has card cages housing a plurality of electronic card modules.

The power is linearly routed from the input line voltage source to the power supply and then to the card cages. This routing creates a single ground path. The grounding path from the power supply to the card cage provides a single path through which ground currents return to a line power ground.

Grounding currents are restricted to this single path. The noise generated on the single path is in part caused by the current multiplied by the resistance of the path. The disadvantage of the single path is that any resistance on the single path has a direct effect on the amount of noise generated.

SUMMARY

An object of the present invention is to provide improved grounding. The grounding has two separate and parallel grounding paths. Any resistance on a grounding path of the parallel paths does not have as much noise generation had the path not been in parallel. The parallel grounding paths decrease high levels of noise generated by a given level of return ground current. The resistance in each path only generates partially the total noise generated from the currents. The resulting noise generated from the two paths is not as large as the noise generated from a single grounding path. The parallel grounding paths provide for reduced noise generation in a computer system. The parallel grounding paths aid in the compliance of electromagnetic interference shielding requirements. The parallel grounding paths are established by the splitting of a grounding wire of the incoming power lines. One path connects to the grounded card cage. The other grounding path connects to the ground line of the power supply. The power supply ground line is connected to the electronic modules. The power supply is also electrically connected to the grounded card cage which is grounded. The ground currents of the line power source return either through the card cage ground path or the power supply ground path.

DRAWING DESCRIPTION

The drawing depicts power distribution routes in a system cabinet wherein is a parallel grounding path.

PREFERRED EMBODIMENT

Referring to the drawing, an input three phase power source 10 is connected to a system cabinet 12 through power lines 14 and a ground line 16. Additionally, the ground line 16 electrically connects to a cabinet frame 18. The system cabinet 12 houses a power distribution unit 20 and a plurality of card cages 22. The power lines 14 and the ground line 16 are connected to the power distribution unit 20. The power distribution unit 20 houses an electromagnetic interference filter 24 and circuit breakers 26. The electromagnetic interference filter 24 supplies filtered power on line 28 and filtered ground on line 30 to the card cages 22. The card cages 22 house a plurality of power supplies 32 and a plurality electronic modules 34.

The power supplies 32 receive power from the power distribution unit 20 and in turn supply regulated power on lines 37 to the electronic modules 34. Additionally, the power supplies 32 supply regulated power ground on lines 38. The power supplies 32 are connected to backplanes, not shown, of the card cages 22. The backplanes, not shown, are connected to the electronic modules 34. The backplanes, not shown, route regulated power on lines 36 and regulated power ground on lines 38 to the electronic modules 34. The lines 36 and 38 are filtered by capacitors 40.

The input three phase power source 10 sources power ground on ground line 16. The line 16 is also connected to the cabinet frame 18. The cabinet frame 18 is electrically connected to the card cages 22 that are in turn electrically connected to the power supplies 32. The power supplies 32 are connected to the card cages 22 through slotted guides, not shown, of the card cages 22. Metal etched conductors, not shown, of the power supplies 32 connect through capacitors 42a and 42b to the slotted guides, not shown, of card cages 22. The slotted guides, not shown, support the power supplies 32 and the electronic modules 34 in the card cages 22.

The input power ground on ground line 16 is connected to the power supplies 32 in a parallel connection. The power supplies 32 are connected to ground line 16 by parallel ground paths that are firstly through the power distribution unit 20, and secondly through the card cages 22 and the cabinet frame 18. These parallel ground paths provide a decreased resistance through which a given current results in a decreased amount of radiated noise. This decreased amount of radiated noise improves the operation of the electronic modules 34.

The regulated power on lines 36 and the ground signal on lines 38 are connected to each other through the filter capacitors 40 as is a common practice in the art. However, the power supplies 32 are connected electrically to the grounded card cages 22 through filter capacitor 42a and 42b.

The filter capacitors 42a connect the ground lines 38 to the grounded card cages 22, and the filter capacitors 42b connected the regulated power lines 36 to the grounded card cages 22. The capacitors 42 are used to minimize noise and the capacitors 43 present a low impedance path to the electrically grounded card cages 22. Consequently, this AC (alternating current) path shunts noise signals to the grounded card cages 22.

What is claimed is:

1. A grounding system including a cabinet housing one or more card cages and wherein each card cage houses one or more electronic modules and a power supply, the system including line power means for providing line power and line ground, comprising means electrically connecting said line power means to the power supply for providing line power to said power supply, means electrically connecting said line power means to the power supply for providing a power supply grounding path between the line ground and power supply and for conducting current, wherein said power supply grounding path comprises a power distribution unit connected with the line power means to provide the line power and the line ground to said power supply and for filtering the power supplied thereby, and said power supply grounding path comprises an electrical path connecting said power distribution unit to said power supply and to said card cage, and means electrically connecting the line ground to the power supply through said card cage to provide a card cage grounding path, whereby two system grounding paths for an electronic module in said card cage are provided (i) through said power supply grounding path between the power supply and the line ground, (ii) through said card cage grounding path between the power supply and the line ground through the card cage.

2. A grounding system including a cabinet housing one or more card cages and wherein each card cage houses one or more electronic modules and a power supply, the system including line power means for providing line power and line ground, comprising means electrically connecting said line power means to the power supply for providing line power to said power supply, means electrically connecting said line power means to the power supply for providing a power supply grounding path between the line ground and power supply and for conducting current, and means electrically connecting the line ground to the power supply through said card cage to provide a card cage grounding path, wherein said card cage grounding path comprises an electrical path from the power supply through filter capacitor means, the card cage, and frame means of said cabinet to line ground for connecting said power supply to said line ground, whereby two system grounding paths for an electronic module in said card cage are provided (i) through said power supply grounding path between the power supply and the line ground, and (ii) through said card cage grounding path between the power supply and the line ground through the card cage.

\* \* \* \* \*